(12) United States Patent
Sprague et al.

(10) Patent No.: US 9,706,683 B2
(45) Date of Patent: Jul. 11, 2017

(54) OUTDOOR ELECTRONIC EQUIPMENT ENCLOSURES AND RELATED METHODS

(75) Inventors: Peter M. Sprague, Big Rock, IL (US); James W. Webster, Bensenville, IL (US); Anthony N. Kordyban, Lombard, IL (US)

(73) Assignee: VERTIV ENERGY SYSTEMS, INC., Lombard, IL (US)

( * ) Notice: Subject to any disclaimer, the term of this patent is extended or adjusted under 35 U.S.C. 154(b) by 1609 days.

(21) Appl. No.: 12/956,829

(22) Filed: Nov. 30, 2010

(65) Prior Publication Data

US 2011/0159795 A1 Jun. 30, 2011

Related U.S. Application Data

(60) Provisional application No. 61/265,193, filed on Nov. 30, 2009.

(51) Int. Cl.
| | |
|---|---|
| *H05K 5/00* | (2006.01) |
| *H05K 7/20* | (2006.01) |
| *F24F 7/007* | (2006.01) |
| *F24F 13/22* | (2006.01) |

(52) U.S. Cl.
CPC ......... *H05K 7/20209* (2013.01); *F24F 7/007* (2013.01); *H05K 7/20145* (2013.01); *H05K 7/20181* (2013.01); *H05K 7/20572* (2013.01); *F24F 2013/221* (2013.01); *F24F 2221/34* (2013.01)

(58) Field of Classification Search
CPC .......... H05K 7/202029; H05K 7/20572; F24F 7/007
USPC .......................................... 454/193; 361/695
See application file for complete search history.

(56) References Cited

U.S. PATENT DOCUMENTS

| | | | | |
|---|---|---|---|---|
| 5,000,381 | A | * | 3/1991 | Mueller et al. ............. 236/44 C |
| 5,832,988 | A | * | 11/1998 | Mistry et al. ................. 165/103 |
| 5,886,296 | A | * | 3/1999 | Ghorbani et al. ............. 174/50 |
| 5,934,368 | A | * | 8/1999 | Tanaka et al. ................ 165/233 |
| 6,105,875 | A | * | 8/2000 | LaGrotta et al. ........... 236/44 A |

(Continued)

FOREIGN PATENT DOCUMENTS

| | | |
|---|---|---|
| JP | 07-027399 | 1/1995 |
| JP | 08-049908 | 2/1996 |

(Continued)

*Primary Examiner* — Steven B McAllister
*Assistant Examiner* — Jonathan Cotov
(74) *Attorney, Agent, or Firm* — Harness, Dickey & Pierce, P.L.C.

(57) ABSTRACT

An electronic equipment enclosure for outdoor deployment includes a housing defining an interior and having an intake port, an exhaust port, an airflow path extending from the intake port to the exhaust port, and an equipment bay for receiving the electronic equipment. The equipment bay is positioned in the airflow path. The equipment enclosure further includes an intake fan for creating positive pressure within the interior of the housing and a pressure-activated damper having an open position for allowing air to exit the enclosure through the exhaust port in response to positive pressure within the interior of the housing and a closed position for preventing external air and/or water from entering the enclosure through the exhaust port when the intake fan is not operating. Other example equipment enclosures and methods are also disclosed.

16 Claims, 4 Drawing Sheets

(56) References Cited

U.S. PATENT DOCUMENTS

| | | | |
|---|---|---|---|
| 6,123,266 A * | 9/2000 | Bainbridge et al. | 236/49.3 |
| 6,127,663 A * | 10/2000 | Jones | F26B 21/06 |
| | | | 219/209 |
| 6,161,765 A * | 12/2000 | Kay et al. | 236/49.3 |
| 6,164,369 A * | 12/2000 | Stoller | 165/104.33 |
| 6,462,944 B1 * | 10/2002 | Lin | 361/679.5 |
| 6,704,198 B2 * | 3/2004 | Replogle et al. | 361/690 |
| 6,877,551 B2 * | 4/2005 | Stoller | 165/47 |
| 6,885,554 B1 * | 4/2005 | Reeck et al. | 361/695 |
| 6,889,752 B2 * | 5/2005 | Stoller | 165/47 |
| 7,419,534 B2 * | 9/2008 | Hirano | 96/111 |
| 7,455,706 B2 * | 11/2008 | Latham et al. | 55/385.1 |
| 7,929,294 B2 * | 4/2011 | Yeh et al. | 361/679.5 |
| 8,072,752 B2 * | 12/2011 | Wantschik | 361/695 |
| 2004/0004815 A1 * | 1/2004 | Lee | 361/695 |
| 2004/0007347 A1 * | 1/2004 | Stoller | 165/47 |
| 2004/0007348 A1 * | 1/2004 | Stoller | 165/47 |
| 2004/0217072 A1 * | 11/2004 | Bash et al. | 211/26 |
| 2007/0115630 A1 * | 5/2007 | Midgley | 361/690 |
| 2007/0224928 A1 * | 9/2007 | Greenslade et al. | 454/184 |
| 2007/0289976 A1 * | 12/2007 | Meyer et al. | 220/592.09 |
| 2008/0055849 A1 * | 3/2008 | Lee | 361/695 |
| 2008/0212286 A1 * | 9/2008 | Komatsu | 361/714 |
| 2008/0239668 A1 * | 10/2008 | Hendrix et al. | 361/695 |
| 2008/0316038 A1 * | 12/2008 | Palaszewski | 340/584 |
| 2009/0302727 A1 * | 12/2009 | Vincent et al. | 312/326 |
| 2010/0206065 A1 * | 8/2010 | Hsiao et al. | 73/170.12 |
| 2011/0297351 A1 * | 12/2011 | Vosper et al. | 165/67 |

FOREIGN PATENT DOCUMENTS

| | | | |
|---|---|---|---|
| JP | 08-088493 | 4/1996 | |
| JP | 11038861 A * | 2/1999 | G03G 21/20 |

* cited by examiner

ND EQUIPMENT
OUTDOOR ELECTRONIC EQUIPMENT ENCLOSURES AND RELATED METHODS

CROSS-REFERENCE TO RELATED APPLICATION

This application claims the benefit of U.S. Provisional Application No. 61/265,193 filed Nov. 30, 2009, the entire disclosure of which is incorporated herein by reference.

FIELD

The present disclosure relates to outdoor electronic equipment enclosures and related methods.

BACKGROUND

This section provides background information related to the present disclosure which is not necessarily prior art.

Electronic equipment enclosures are often deployed out-of-doors for housing and protecting various types of electronic equipment such as telecommunications equipment, cable television (CATV) equipment and/or data transmission equipment. Such equipment is sometimes referred to as "outside plant equipment." The equipment enclosures may be located virtually anywhere on Earth, where they may be exposed to inhospitable climates having very warm, cold, wet, dry, dusty, sandy, salty and/or windy conditions.

SUMMARY

According to one aspect of the present disclosure, an outdoor electronic equipment enclosure includes a housing defining an interior and having an intake port, an exhaust port, an airflow path extending from the intake port to the exhaust port, and an equipment bay for receiving the electronic equipment. The equipment bay is positioned in the airflow path between the intake port and the exhaust port. The enclosure further includes an intake fan for creating positive pressure within the interior of the housing when the fan is operating, and a pressure-activated damper having an open position for allowing air to exit the enclosure through the exhaust port in response to positive pressure within the interior of the housing and a closed position for preventing external air and/or water from entering the enclosure through the exhaust port when the intake fan is not operating.

According to another aspect of the present disclosure, an outdoor electronic equipment enclosure includes a housing defining an interior and having an intake port, an exhaust port and an airflow path extending from the intake port to the exhaust port. The enclosure further includes at least one fan for moving air through the airflow path extending from the intake port to the exhaust port, a first sensor for measuring an air temperature external to the enclosure, a second sensor for measuring an air temperature within the interior of the housing, and a controller operatively coupled to the fan, the first sensor and the second sensor. The controller is configured to selectively operate the fan to maintain a defined temperature differential between the air temperature external to the enclosure and the air temperature within the interior of the housing to thereby inhibit condensation within the interior of the housing.

According to yet another aspect of the present disclosure, a method is provided for inhibiting condensation in an outdoor electronic equipment enclosure. The method includes determining a maximum expected dew point at a location of the outdoor electronic equipment enclosure, and maintaining an air temperature within an interior of the enclosure above the determined maximum expected dew point to thereby avoid condensation within the interior of the enclosure.

Further aspects and areas of applicability will become apparent from the description provided herein. It should be understood that various aspects of this disclosure may be implemented individually or in combination with one or more other aspects. It should also be understood that the description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

DETAILED DESCRIPTION

Example embodiments will now be described more fully with reference to the accompanying drawings.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a", "an" and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on", "engaged to", "connected to" or "coupled to" another element or layer, it may be directly on, engaged, connected or coupled to the other element or layer, or intervening elements or layers may be present. In contrast, when an element is referred to as being "directly on," "directly engaged to", "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Figure 1:
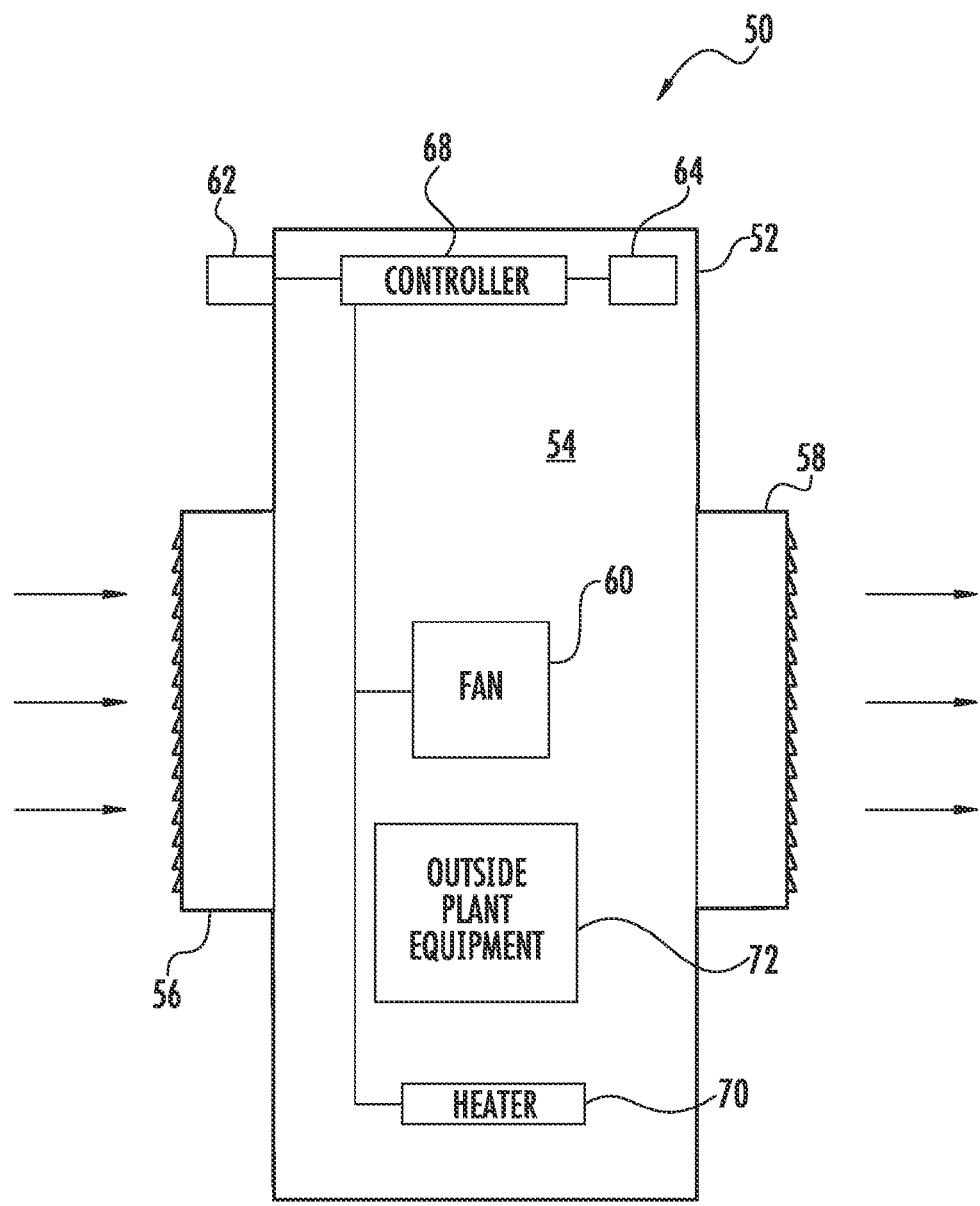
FIG. 1 is a block diagram of an outdoor electronic equipment enclosure according to one example embodiment of the present disclosure.

An electronic equipment enclosure for outdoor applications according to one example embodiment of the present disclosure is illustrated in FIG. 1 and indicated generally by reference number 50. As shown in FIG. 1, the enclosure 50 includes a housing 52 defining an interior 54. The housing 52 includes an intake port 56 and an exhaust port 58. An airflow path extends between the intake port 56 and the exhaust port 58. The enclosure further includes at least one fan 60 for moving air through the airflow path extending from the intake port 56 to the exhaust port 58, a sensor 62 for measuring an air temperature external to the enclosure 50, a sensor 64 for measuring an air temperature within the interior of the housing 52, and at least one controller 68 operatively coupled to the fan 60 and the sensors 62, 64. The controller 68 may be configured to selectively operate the fan 60 to maintain a defined temperature differential between the air temperature external to the enclosure 50 and the air temperature within the interior 54 of the housing 52. In this manner, the controller 68 may inhibit the formation of condensation within the interior of the housing.

The defined temperature differential maintained by the controller 68 may be a fixed temperature differential. For example, the controller 68 may be configured to maintain the internal temperature within the interior 54 of the housing 52 approximately three or five degrees Celsius above the external (i.e., ambient) temperature. Alternatively, the defined temperature differential may vary depending on one or more other parameters. For example, the controller 68 may be configured to maintain the internal temperature at a first temperature when the external temperature falls within a first range (e.g., above zero degrees Celsius), and at a second temperature when the external temperature falls within a second range (e.g., below zero degrees Celsius).

The housing 52 may include a door, a removable panel or another suitable provision for providing access to components within the interior 54 of the housing 52. Accordingly, the intake port 56 and/or the fan 60 may be positioned over an opening in a door, a removable panel or another suitable portion of the housing 52, with the airflow path extending through such opening, as will be further apparent from the description below.

As shown in FIG. 1, the enclosure 50 may optionally include a heater 70. In that event, the controller 68 may be configured to control operation of the heater 70 as necessary to maintain the defined temperature differential discussed above.

Under typical operating conditions, the controller 68 can reduce the temperature within the enclosure 50 by turning on or increasing the speed of one or more intake fans. Conversely, the controller can typically increase the temperature within the enclosure by turning off or decreasing the speed of one or more intake fans and/or by turning on one or more heaters. Although the enclosure 50 of FIG. 1 does not include an air conditioning unit for providing cooling and/or controlling humidity, the controller 68 may still inhibit formation of condensation or otherwise control humidity by maintaining the defined temperature differential. In other embodiments, one or more air conditioners can be employed for cooling and/or controlling humidity within the interior 54 of the housing 52.

When deployed in an outdoor environment, the enclosure 50 will house and protect one or more pieces of outside plant equipment 72, as indicated generally in FIG. 1.

Although not shown in FIG. 1, the enclosure 50 may also include hydrophobic or other filter(s) and/or damper(s) for preventing water and/or contaminates from reaching the interior 54 of the housing 52 through the intake port 56 or the exhaust port 58.

As an alternative to maintaining the defined temperature differential, the controller 68 may be configured to maintain a particular temperature or humidity level in the enclosure 50, as further explained below. In this regard, the enclosure 50 may include components, such as one or more humidity sensors, in addition to the components illustrated in FIG. 1.

Figure 2:
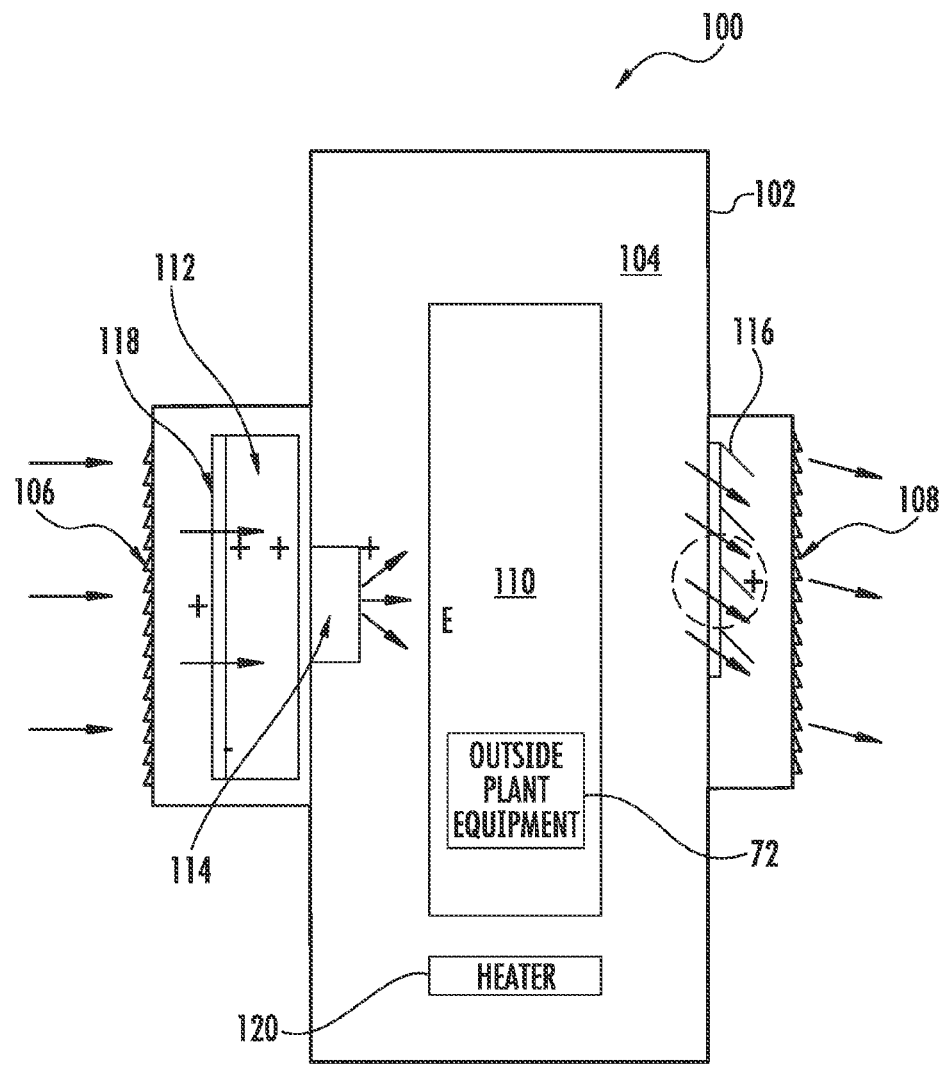
FIG. 2 is a block diagram of an outdoor electronic equipment enclosure according to another example embodiment of this disclosure.

FIG. 2 illustrates an outdoor electronic equipment enclosure 100 according to another example embodiment of the present disclosure. As shown in FIG. 2, the enclosure 100 includes a housing 102 defining an interior 104 and having an intake port 106, an exhaust port 108, an airflow path extending from the intake port 106 to the exhaust port 108, and an equipment bay 110 for receiving the electronic equipment. The equipment bay 110—which may be at any desired location(s) within the interior 104 of the enclosure 100—is positioned in the airflow path between the intake port 106 and the exhaust port 108. In this manner, air passes around and/or through the electronic equipment horizontally, vertically and/or at other angles as may be necessary or desired for controlling the temperature of the electronic equipment.

The enclosure 100 further includes at least one intake fan 114 and at least one pressure-activated damper 116. The intake fan 114 creates positive pressure within the interior 104 of the housing 102 when the fan 114 is operating. The pressure-activated damper 116 is movable between an open position for allowing air to exit the enclosure 100 through the exhaust port 108 in response to positive pressure within the interior 104 of the housing 102, and a closed position for preventing external air and/or water from entering the enclosure 100 through the exhaust port 108 when the intake fan 114 is not operating.

Figure 3:
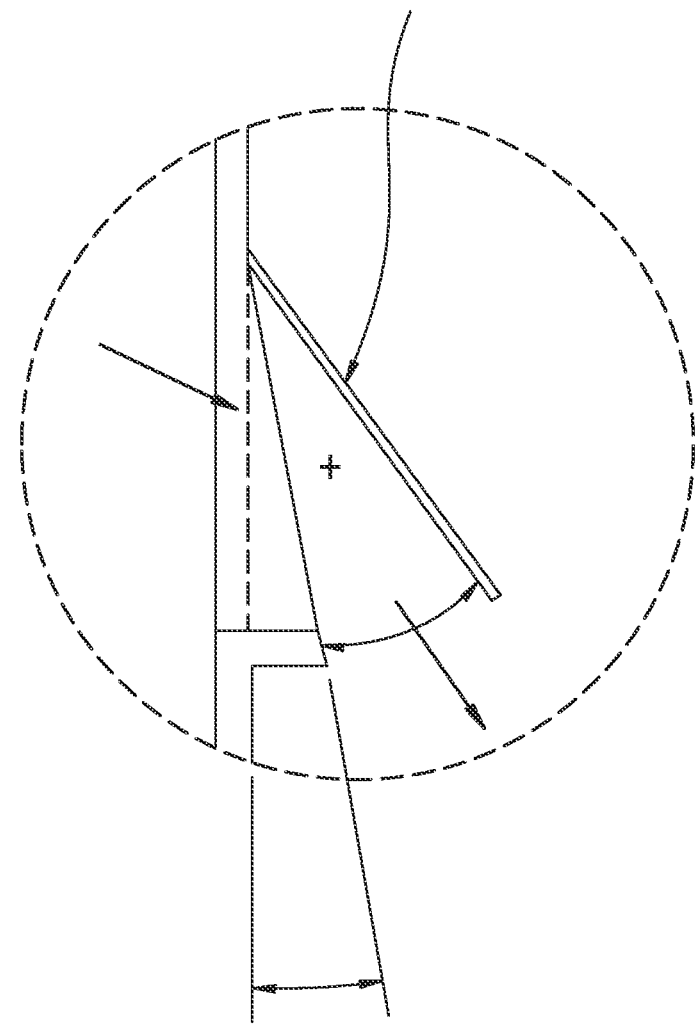
FIG. 3 is an enlarged view of one flap of the pressure-activated damper shown in FIG. 2.

The pressure-activated damper 116 may be a passive damper, such as a gravity-operated damper, or an active damper such as an electromechanical damper. In some embodiments, including the embodiment shown in FIG. 2, the pressure-activated damper 116 is a gravity-operated damper that automatically pivots open in response to positive pressure within the interior of the enclosure. The damper 116 may include several flaps formed of plastic, rubber, metal or any other suitable material or combination of materials. FIG. 3 illustrates one of the damper flaps in the open position. FIG. 3 also illustrates that when the damper 116 is in the closed position, each flap is preferably oriented between about zero degrees (i.e., vertically) and about forty-five degrees from the vertical axis of the enclosure. It should be understood, however, that other dampers and flap orientations may be employed, including various types of active dampers, without departing from the scope of this disclosure.

As shown in FIG. 2, the enclosure 100 may also include a filter 112 positioned in the airflow path between the intake port 106 and the equipment bay 110. In that event, positive pressure created within the interior of the enclosure by the intake fan 114 forces filtered air out of the enclosure 100 through the exhaust port 108 and any cracks or leaks in the enclosure 100. The enclosure 100 of FIG. 2 does not include an exhaust fan associated with the exhaust port, which could create negative pressure within the enclosure that, in turn, could draw unfiltered outdoor air into the enclosure 100 through any cracks or leaks in the enclosure. However, exhaust fans may be employed in other embodiments without departing from the scope of this disclosure. When exhaust fan(s) are employed, they are preferably sized and/or operated so that the intake fan(s) and the exhaust fan(s) collectively maintain positive pressure (or zero pressure) within the interior of the enclosure.

The filter 112 (and the filters employed in the embodiment of FIG. 1, if any) may be a hydrophobic and/or membrane filter for preventing solid and/or liquid contaminates from reaching the interior 104 of the housing 102 via the intake port 106. For example, the hydrophobic filter 112 may be a hydrophobic membrane filter. Examples of suitable hydrophobic membrane filters include those available from Gore and Schrofftec. In some embodiments, the hydrophobic filter has a pore size sufficient to filter out, among other things, salt particles in marine environments. Alternatively, other types of filters may be employed. If a filter capable of blocking liquids is not employed, the enclosure will preferably including a drain for removing any water that passes through the filter before the water can reach the electronic equipment within the enclosure.

The intake fan 114 is adapted to draw outside air through the intake port 106 and the hydrophobic filter 112, and create positive pressure within the interior 104 of the enclosure 100. The intake fan 114 may have one or more discrete speeds, and may be a variable-speed fan. As outdoor air is drawn through the hydrophobic filter, the hydrophobic filter removes solids and/or liquids from the air before the air enters the interior of the enclosure. When the damper 116 is in the open position, air preferably exits (and does not enter) the enclosure 100 through the exhaust port 108 due to the positive pressure within the interior of the housing 102.

When the intake fan is off, the hydrophobic filter 112 prevents solid and/or liquid contaminants from entering the enclosure through the intake port 106. Further, when the intake fan is off, the flaps of the pressure-activated damper 116 close (due to the force of gravity) to prevent solid and/or liquid contaminants from entering the enclosure through the exhaust port 108. Accordingly, the enclosure 100 is not required to have a hydrophobic filter associated with the exhaust port, in addition to the hydrophobic filter 112 associated with the intake port 106. Thus, the expense of an exhaust port hydrophobic filter can be avoided, if desired. Alternatively, the exhaust port may also be provided with a hydrophobic or other filter, if desired, to further ensure no solid and/or liquid contaminants enter the enclosure via the exhaust port 108.

As shown in FIG. 2, the enclosure 100 may also include, if desired, a particle filter 118 positioned in the airflow path upstream of the hydrophobic filter 112 (i.e., air entering the intake port 106 passes through the particle filter 118 before reaching the hydrophobic filter 112), and a heater 120, which may be an electric heater. A controller (not shown), such as an environmental control unit (ECU), may also be provided for selectively controlling operation of the fan(s) and heater(s) as may be desired for any given application of these teachings.

The controller may be configured to operate fan(s), heater(s) and air conditioners (if employed) as necessary to maintain the internal temperature or humidity of the enclosure at a defined level. For example, the controller may be configured to operate the heater(s) as necessary to maintain the air temperature within the enclosure above the freezing temperature of water (i.e., zero degrees Celsius) or some other desired temperature (above or below zero degrees Celsius). In some embodiments, the controller is configured to shutdown the intake fan(s) and turn on one or more circulating fans within the interior of the enclosure before operating the heater. The controller may also be configured to maintain a positive temperature differential between the internal temperature of the enclosure and the external (i.e., ambient) temperature outdoors, as described above, using one or more sensors (not shown in FIG. 2). Further still, the controller may be configured to maintain the internal temperature at or above a setpoint temperature, which may be greater than the maximum expected dew point at the location of the enclosure, as described below. At the same time, the controller may also maintain the internal temperature of the enclosure within operating limits of the electronic equipment within the enclosure. The controller may be a separate component, such as an environmental control unit, or may be integrated with the intake fan(s), heater(s), sensor(s), and/or other components.

Additionally, or alternatively, the controller may be configured to inhibit condensation by controlling the relative humidity within the interior of the enclosure. For example, the controller may be configured to maintain the relative humidity in the enclosure below a particular setpoint, such as 65% relative humidity. Maintaining a low relative humidity may also reduce corrosion of equipment within the enclosure, which can occur even without condensation.

As noted above, the controller can be configured to control humidity and/or inhibit formation of condensation without employing an air conditioner. It should be understood, however, that one or more air conditioners may be employed for cooling and/or controlling humidity within the interior of the housing without departing from the scope of this disclosure.

When deployed in an outdoor environment, the enclosure 100 will house and protect one or more pieces of outside plant equipment 72, as indicated generally in FIG. 2.

Figure 4:
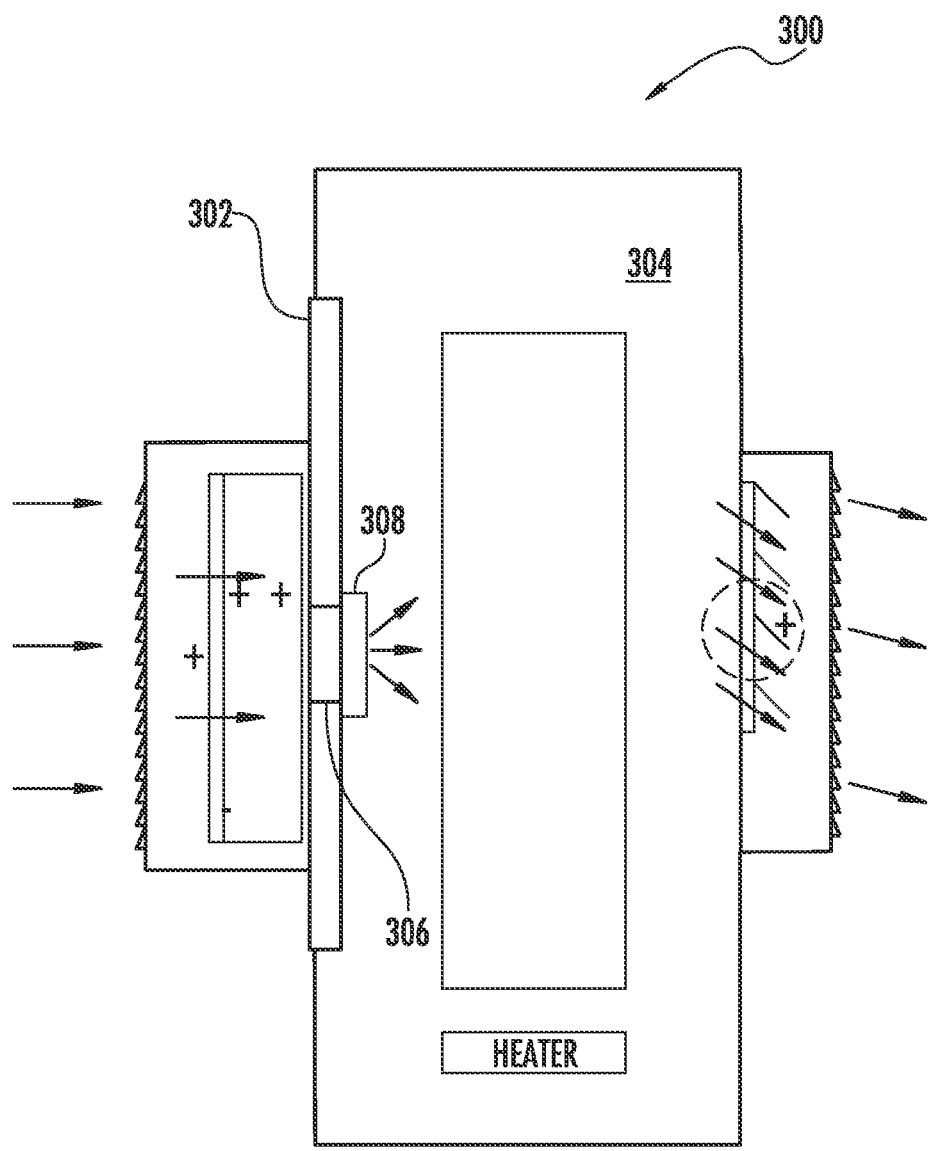
FIG. 4 is a block diagram of an outdoor electronic equipment enclosure having a door according to yet another example embodiment of the present disclosure.

The enclosure 100 (as well as the enclosure 50 of FIG. 1) may have a monolithic or multi-part construction, possibly including one or more doors, removable panels, or other provisions for accessing the interior of the housing. In some embodiments, including the example embodiment shown in FIG. 4, an enclosure 300 may include a door 302 having an opening 306 extending therethrough. The airflow path extends through door opening 306, and the intake fan 308 is mounted to the door 302 over the opening 306 for drawing preferably filtered air into the interior 304 of the enclosure 300.

Baffles may also be provided on the intake and exhaust ports (as shown in FIGS. 1-3) to force entering and/or exiting air through a convoluted path, to reduce airspeed and protect the damper flaps (if applicable).

When the enclosures described herein are deployed outdoors, they can house and protect various types of electronic equipment. By employing one or more teachings herein for controlling environmental conditions (e.g., temperature, humidity and/or condensation) within the enclosure, the need to use hardened electronic equipment can be reduced or eliminated, resulting in further cost savings. Similarly, due to the enclosure designs, electronic equipment rated for near-ambient temperatures and/or non-condensing humidity levels (e.g., non-hardened equipment) may be advantageously deployed in the enclosures.

According to another aspect of the present disclosure, a method is provided for inhibiting condensation in an outdoor electronic equipment enclosure. The method includes determining a maximum expected dew point on an external side of the enclosure, and maintaining an air temperature within an interior of the enclosure above the determined maximum expected dew point to thereby inhibit formation of condensation within the interior of the enclosure.

If the equipment enclosure includes a ventilating fan (such as an intake or exhaust fan) and/or a heater, the fan and/or heater may be selectively operated to maintain the air temperature within the enclosure interior above the determined maximum expected dew point.

The method described above can be practiced with a wide variety of outdoor electronic equipment enclosures including, without limitation, the example outdoor equipment enclosures described above.

The foregoing description of the embodiments has been provided for purposes of illustration and description. It is not intended to be exhaustive or to limit the invention. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the invention, and all such modifications are intended to be included within the scope of the invention.

The invention claimed is:

1. An outdoor electronic equipment enclosure, comprising:
    a housing defining an interior and having an intake port, an exhaust port, and an airflow path extending from the intake port to the exhaust port;
    at least one fan for moving air through the airflow path extending from the intake port to the exhaust port;
    a first sensor for measuring an air temperature external to the enclosure;
    a second sensor for measuring an air temperature within the interior of the housing; and
    a controller operatively coupled to the fan, the first sensor and the second sensor, the controller configured to selectively operate the fan to maintain a defined temperature differential between the air temperature external to the enclosure and the air temperature within the interior of the housing to thereby inhibit condensation within the interior of the housing.

2. The outdoor enclosure of claim 1 wherein the defined temperature differential is a fixed temperature differential.

3. The outdoor enclosure of claim 2 wherein the defined temperature differential is approximately five degrees Celsius.

4. The outdoor enclosure of claim 2 wherein the outdoor enclosure does not include an air conditioner.

5. The outdoor enclosure of claim 4 wherein the housing includes a door having an opening extending therethrough, wherein the airflow path passes through the door opening, and wherein the fan is mounted to the door over the door opening.

6. The outdoor enclosure of claim 5 further comprising a pressure-activated damper having an open position for allowing air to exit the outdoor enclosure through the exhaust port in response to positive pressure within the interior of the housing and a closed position for preventing external air and/or water from entering the enclosure through the exhaust port when the intake fan is not operating.

7. The outdoor enclosure of claim 2 wherein the equipment enclosure is deployed in an outdoor environment and includes at least one item of outside plant equipment positioned within the housing interior.

8. The outdoor enclosure of claim 2 further comprising a filter positioned in the airflow path between the intake port and the at least one fan.

9. The outdoor enclosure of claim 8 wherein the filter includes a particle filter.

10. The outdoor enclosure of claim 8 wherein the filter includes a hydrophobic filter.

11. The outdoor enclosure of claim 10 wherein the filter further includes a particle filter positioned in the airflow path upstream of the hydrophobic filter.

12. The equipment enclosure of claim 10 wherein there is no hydrophobic filter associated with the exhaust port.

13. The outdoor enclosure of claim 2 wherein there is no exhaust fan associated with the exhaust port.

14. The outdoor enclosure of claim 2 wherein the housing includes a door having an opening extending therethrough, wherein the airflow path passes through the door opening, and wherein the fan is mounted to the door over the door opening.

15. The outdoor enclosure of claim 2 further comprising a pressure-activated damper having an open position for allowing air to exit the outdoor enclosure through the exhaust port in response to positive pressure within the interior of the housing and a closed position for preventing external air and/or water from entering the enclosure through the exhaust port when the intake fan is not operating.

16. The outdoor enclosure of claim 1 further comprising a heater, wherein the controller is configured to selectively operate the heater to maintain the defined temperature differential.

* * * * *